United States Patent
Chen et al.

(10) Patent No.: US 8,779,581 B2
(45) Date of Patent: Jul. 15, 2014

(54) HEAT DISSIPATING SEMICONDUCTOR DEVICE PACKAGES

(75) Inventors: Kuang-Hsiung Chen, Taoyuan (TW);
Sheng-Ming Wang, Taoyuan (TW);
Yu-Ying Lee, Taichung (TW);
Hsiang-Ming Feng, Tainan (TW);
Bing-Yun Cheng, New Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 277 days.

(21) Appl. No.: 13/290,772

(22) Filed: Nov. 7, 2011

(65) Prior Publication Data
US 2012/0112338 A1    May 10, 2012

(30) Foreign Application Priority Data
Nov. 8, 2010   (TW) ................................ 99138404 A

(51) Int. Cl.
*H01L 23/36*   (2006.01)

(52) U.S. Cl.
USPC .................... 257/712; 257/796; 257/E23.104

(58) Field of Classification Search
USPC ................................................. 257/E23.104
See application file for complete search history.

(56) References Cited

U.S. PATENT DOCUMENTS

| | | | | |
|---|---|---|---|---|
| 5,883,430 A * | 3/1999 | Johnson | ......................... | 257/706 |
| 5,986,340 A * | 11/1999 | Mostafazadeh et al. | ...... | 257/713 |
| 6,472,743 B2 * | 10/2002 | Huang et al. | ................... | 257/717 |
| 6,918,178 B2 * | 7/2005 | Chao et al. | ...................... | 29/841 |
| 6,933,619 B2 * | 8/2005 | Caletka et al. | ................ | 257/796 |
| 7,202,561 B2 * | 4/2007 | Seo | ............................... | 257/720 |

FOREIGN PATENT DOCUMENTS

| | | |
|---|---|---|
| TW | M250323 | 11/2004 |
| TW | I244167 | 11/2005 |
| TW | I277500 | 4/2007 |
| TW | 201019454 | 5/2010 |

\* cited by examiner

*Primary Examiner* — Stephen W Smoot
(74) *Attorney, Agent, or Firm* — Klein, O'Neill & Singh, LLP

(57) ABSTRACT

An embodiment of a method for making semiconductor device packages includes a heat sink matrix and a substrate. A plurality of semiconductor devices are attached to the substrate. Then, a package body is formed between the heat sink matrix and the substrate, wherein the package body encapsulates the semiconductor devices. Then, a plurality of first cutting slots is formed, wherein the first cutting slots extend through the heat sink matrix and partially extend into the package body. Then, a plurality of second cutting slots is formed, wherein the second cutting slots extend through the substrate and through the package body to the first cutting slot, thereby singulating the heat sink matrix and substrate into a plurality of individual semiconductor device packages.

12 Claims, 9 Drawing Sheets

US 8,779,581 B2

HEAT DISSIPATING SEMICONDUCTOR DEVICE PACKAGES

CROSS-REFERENCE TO RELATED APPLICATIONS

This application claims the benefit of Taiwan application Serial No. 99138404, filed on Nov. 8, 2010, the subject matter of which is incorporated herein by reference.

TECHNICAL FIELD

The present embodiments relate to semiconductor device assembly and packaging.

DESCRIPTION OF THE RELATED ART

In one conventional process of manufacturing semiconductor device packages, a semiconductor die is assembled on a substrate. Typically, this step may be performed in a matrix format where the substrate has multiple die sites that are eventually singulated into individual semiconductor device packages. Next, heat sinks are attached to the dies. Then, an encapsulant or package body, which is typically a plastic material, is fox over the dies and portions of the heat sinks. However, the top surfaces of the heat sinks are left exposed from the encapsulant to facilitate dissipation of heat generated by the dies during operation. The substrates and the package bodies are then singulated to form a plurality of semiconductor device packages. Singulation generally involves sawing, which can leave metal burrs at the edges of the singulated packages. These metal burrs may create electrical shorts in the packages. It would thus be advantageous to reduce or eliminate these burrs.

SUMMARY

One of the present embodiments comprises a method of making a plurality of semiconductor device packages. The method comprises coupling a plurality of semiconductor devices to a substrate. The method further comprises placing the substrate in apposition with a heat sink matrix, wherein the semiconductor devices are disposed between the substrate and the heat sink matrix. The method further comprises forming a package body between the heat sink matrix and the substrate, wherein the package body encapsulates the semiconductor devices. The method further comprises forming a plurality of first cutting slots extending through the heat sink matrix and partially extending into the package body. The method further comprises forming a plurality of second cutting slots. The second cutting slots extend through the substrate and into the package body to the first cutting slots, thereby singulating the plurality of semiconductor device packages.

Another of the present embodiments comprises semiconductor device package. The package comprises a substrate including a first surface. The package further comprises a semiconductor device is attached to the first surface of the substrate. The package further comprises a package body disposed on the first surface of the substrate and covering at least the semiconductor device. The package body includes a first portion having a first lateral surface and a second portion having a second lateral surface that is not coplanar with the first lateral surface. The package further comprises a heat dissipation unit disposed on the package body. The first lateral surface is substantially coplanar with a lateral surface of the heat dissipation unit, and the second lateral surface is substantially coplanar with a lateral surface of the substrate.

Another of the present embodiments comprises a method of making a plurality of semiconductor device packages. The method comprises coupling a plurality of semiconductor devices to a substrate. The method further comprises placing the substrate in apposition with a heat sink matrix. The method further comprises forming a package body between the heat sink matrix and the substrate, wherein the package body encapsulates the semiconductor devices. The method further comprises forming a plurality of first cuts extending through the heat sink matrix and partially extending into the package body. The method further comprises, after forming the plurality of first cuts, forming or placing a plurality of electrical contacts on a surface of the substrate. The method further comprises reflowing the plurality of electrical contacts.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1A:
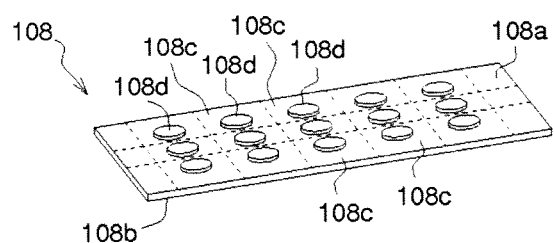
FIGS. 1A-1L illustrate process steps in one of the present embodiments of making a semiconductor device package.

Referring to FIG. 1A, a matrix of heat sinks 108 according to one of the present embodiments is illustrated. In the illustrated embodiment, the heat sink matrix 108 is a metal plate having a first surface 108a and a second surface 108b opposite the first surface 108a. The heat sink matrix 108 defines a plurality of heat dissipation units 108c, or heat sinks. Each dissipation unit 108c has a protruding element 108d. The shape of the protruding element may be circular (as shown in FIG. 1A), rectangular, or any other shape as preferred for given design requirements. In the present embodiment, the protruding element 108d reduces a distance between the semiconductor die (shown in subsequent figures) and the heat dissipation units 108c so that heat generated by the semiconductor die during operation is more effectively dissipated through the heat dissipation units 108c. In some embodiments the protruding element may contact the die.

The heat sink matrix 108 comprise a material with good thermal conductivity, such as nickel, tin, copper, iron, zinc, aluminum, alloys thereof, or any other material(s). The surfaces 108a and 108b of the heat sink matrix 108 may be plated, such as with a nickel layer, a nickel palladium layer, or any other material(s).

Figure 1B:
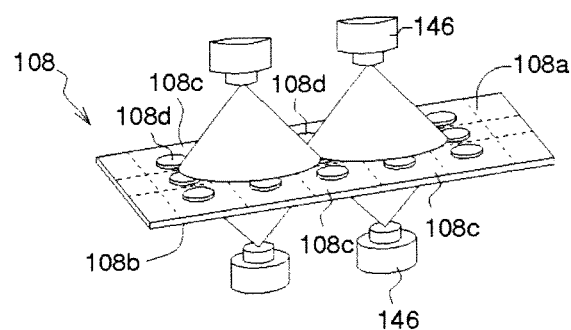

Referring to FIG. 1B, a pumicing process is performed on the first and second surfaces 108a, 108b of the heat sink matrix 108 with a pumicing tool 146. The pumicing process coarsens or roughens the first and second surfaces 108a, 108b. Such roughening enhances the mating of a package body with the heat dissipation unit 108c, which is a subsequent step in the present process. The pumicing process may be performed on the first and second surfaces 108a, 108b at the same time, in sequential steps, or only on one of the surfaces 108a, 108b (such as the first surface 108a) that will contact the subsequently formed package body.

The average roughness of the coarsened surface(s) may be larger than 2 μm to enhance mating between the package body and the coarsened surface. According to a reliability test performed by the inventors, an average roughness value of larger than 2 μm was found to strongly resist peeling of the package body from the roughened surface.

Figure 1C:
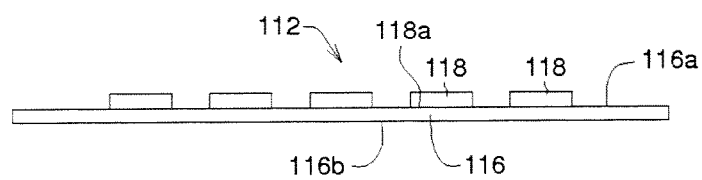

FIG. 1C illustrates a substrate 116, which will subsequently be combined with the heat sink matrix 108. The substrate 116 has a first surface 116a and a second surface 116b opposite the first surface 116a. The substrate 116 has a plurality of die sites 118a on the first surface 116a, which may be the upper surface. Each die site 118a receives a semiconductor die 118. The dies 118/die sites 118a may be in a strip format or a matrix format, often referred to as a panel, or any other format. Together, the substrate 116 and the semiconductor dies 118 form a die/substrate assembly 112.

Figure 1D:
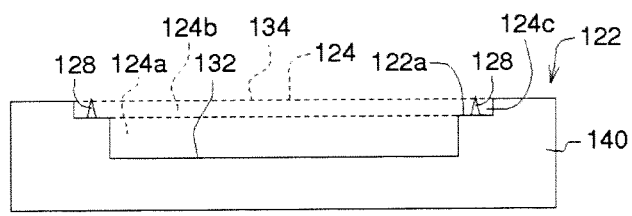

FIG. 1D illustrates a package mold 122, which is used in subsequent steps of the present process. The package mold 122 includes a mold body 140 having a two stage cavity 124. A first stage cavity 124a is located in a lower portion of the mold body 140 and has a cavity bottom surface 132. A second stage cavity 124b is located above the first stage cavity 124a, and has a larger width than the first stage cavity 124a. The greater width of the second stage cavity 124b creates a shoulder 122a around the perimeter of the first stage cavity 124a. A volume adjacent the shoulder 122a forms a recess 124c. In this embodiment, a depth of the first stage cavity 124a is greater than a depth of the second stage cavity 124b, as further discussed below.

With continued reference to FIG. 1D, an alignment device 128 is disposed adjacent to the recess 124c on the shoulder 122a in the second stage cavity 124b. In this embodiment, the alignment device 128 is a guide pin that protrudes from the surface 122a, but does not extend above an upper surface of the mold body 140.

Figure 1E:
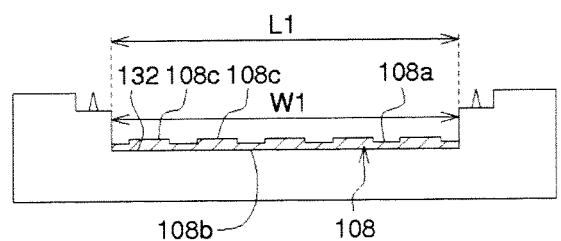

With reference to FIG. 1E, the heat sink matrix 108 is disposed in the first stage cavity 124a of the package mold 122 with the first surface 108a facing out of the cavity 124a. The second surface 108b abuts a bottom surface 132 of the first stage cavity 124a. The heat sink matrix 108 may or may not be secured to the package mold 122. For example, an adhesive, such as double-sided tape may be disposed between the second surface 108b and the bottom surface 132 to hold the heat sink matrix 108 in place during the molding process. A perimeter shape and perimeter dimensions of the heat sink matrix 108 are substantially equal to the shape and dimensions of the first stage cavity 124a, but with a slight clearance such that the heat sink matrix 108 can be placed within the mold body 140 without interference or binding.

Figure 1F:
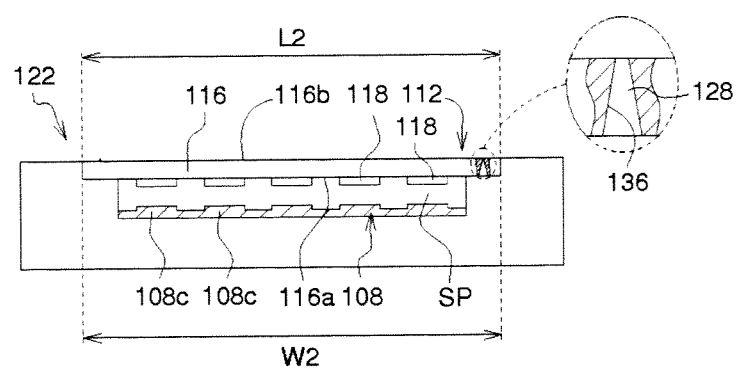

With reference to FIG. 1F, the die/substrate assembly 112 is disposed in the second stage cavity 124b with an outer ring of the die/substrate assembly 112 abutting the shoulder 122a. The first surface 116a of the die/substrate assembly 112 faces into the cavity 124b such that the semiconductor dies 118 face the heat sink matrix 108 with each die 118 aligned one-to-one with a corresponding heat sink 108c. There is a gap between each semiconductor die 118 and its corresponding heat sink 108c.

As indicated in the detail portion of FIG. 1F, the die/substrate assembly 112 includes a guide hole 136. When the die/substrate assembly 112 is positioned in the package mold 122, the alignment device 128 coincides with the guide hole 136 so that the die/substrate assembly 112 is properly positioned in the second stage cavity 124b. Preferably, the fit between the alignment device 128 and the guide hole 136 is close, so that the semiconductor dies 118 are precisely positioned over their respective heat dissipation units 108c.

In an alternative embodiment, the perimeter shape and perimeter dimensions of the die/substrate assembly 112 may be substantially equal to the perimeter shape and perimeter dimensions of the second stage cavity 124b. In such an embodiment, the alignment devices 128 and the guide holes 136 may be omitted.

As discussed above, the depth of the first stage cavity 124a is greater than the depth of the second stage cavity 124b. The depth of the first stage cavity 124a accommodates the thickness of the semiconductor dies 118, any associated wire bonding, if present, and the thickness of the heat sink matrix 108, including the protruding elements 108d, such that there is a gap or space (SP) between the semiconductor dies 118 and their respective protruding elements 108d. However, in alternative embodiments, the semiconductor dies 118 may contact the protruding elements 108d. The depth of the second stage cavity 124b accommodates the thickness of the substrate 116.

Figure 1G:
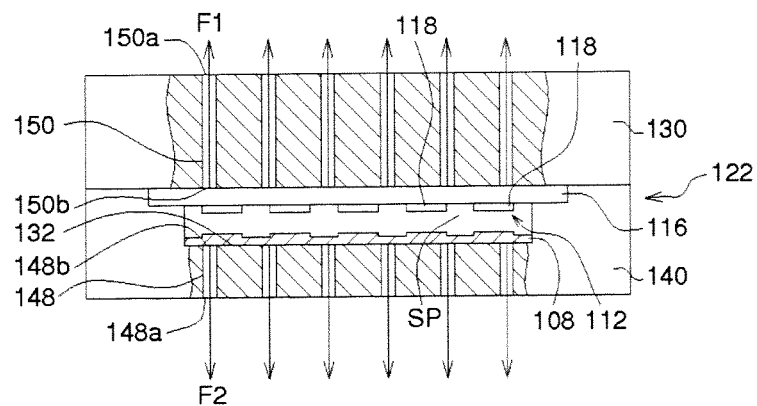

FIG. 1G illustrates a clamping operation, wherein a mold 130 is applied to the second surface 116b of the substrate 116, clamp the die/substrate assembly 112 to the package mold 122. The mold body 140 of the package mold 122 has at least one channel 148 extending therethrough. The channel 148 has an external orifice 148a and an internal orifice 148b at the cavity bottom surface 132. Similarly, the mold 130 has at least one channel 150 extending therethrough. The channel 150 has an external orifice 150a and an internal orifice 150b at a clamping region of the mold 130.

After clamping, a vacuum process is performed. The die/substrate assembly 112 is held firmly in place from inadvertent movement and vacuum forces F1, F2 are applied through the channels 148, 150. The vacuum forces F1, F2 preserve the planarity of the heat sink matrix 108 and the substrate 116 by holding them firmly against planar surfaces of the mold 130 and the mold body 140, thereby resisting sagging or bowing of the heat sink matrix 108 and the die/substrate assembly 112. The vacuum forces F1, F2 are maintained through subsequent molding steps. Thus, in addition to enhancing proper alignment of the die/substrate assembly 112 with the heat sink matrix 108, the vacuum process reduces or eliminates warpage in the finished devices that may result from the subsequent molding steps.

Figure 1H:
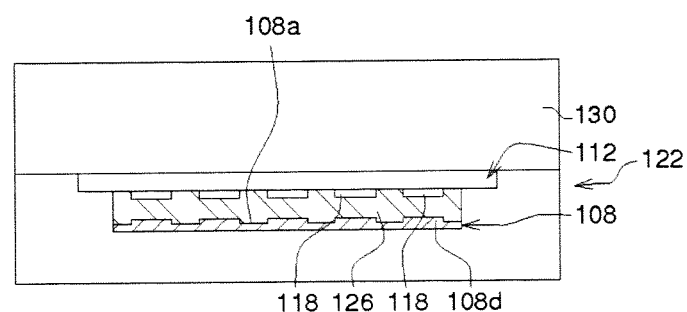
Figure 1I:
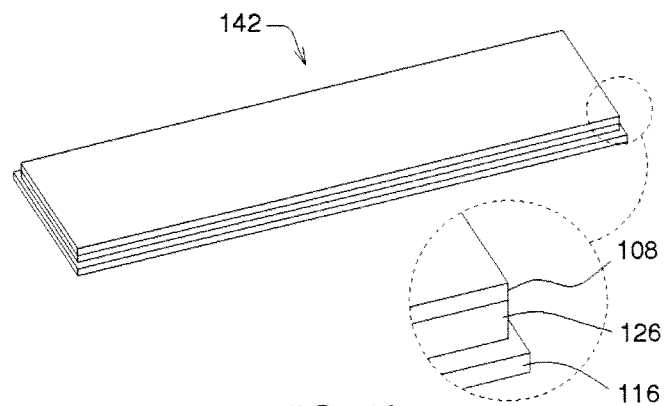

With reference to FIG. 1H, an encapsulant is inserted into the space SP between the heat sink matrix 108 and the die/substrate assembly 112. The insertion may comprise transfer molding, compression molding, or any other molding technique. The encapsulant forms a package body 126, which covers or encapsulates the semiconductor dies 118. With reference to FIG. 1I, the package body 126, the die/substrate assembly 112 and the heat sink matrix 108 together form a matrix of packaged devices 142.

Note that in this embodiment, portions of the package body 126 are interposed between the semiconductor dies 118 and the protruding elements 108d. If the X-Y dimensions of the heat sink matrix 108 are substantially equal to the X-Y dimensions of the first stage cavity 124a then lateral surfaces of the heat sink matrix will abut with side walls of the first stage cavity 124a such that package body 126 will not form on the lateral surfaces of the heat sink matrix 108. However, if the X-Y dimensions of the heat sink matrix are slightly less than the X-Y dimensions of the first stage cavity, then a portion of the package body 126 may form on one or more of the lateral surfaces of the heat sink matrix 108.

The package body 126 may comprise a material such as novolac-based resin, epoxy-based resin, silicone-based resin or any other suitable encapsulant. The package body 126 can also be made from other dielectric materials, such as photo-resist. The package body 126 may also include suitable filler, such as powdered silicon dioxide or any other filler.

With reference to FIG. 1I, the matrix of packaged devices 142 has been removed from the package mold 122. As shown in the detail view of FIG. 1I, the substrate 116 has a larger perimeter than both the package body 126 and the heat sink matrix 108. The lateral surfaces of the package body 126 and the heat sink matrix 108 are substantially coplanar.

Figure 1J:
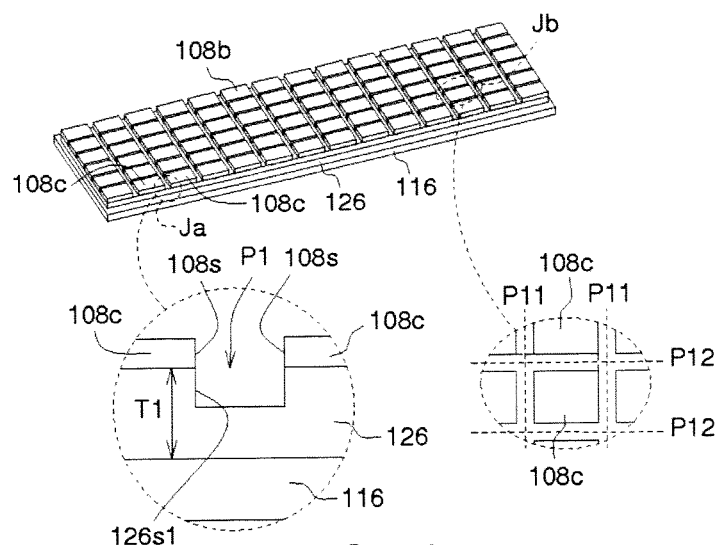

With reference to FIG. 1J, a first singulation is performed on the matrix of packaged devices 142. The first singulation may comprise sawing, laser cutting, abrasion, or any other singulation technique. With reference to the detail view on the left of FIG. 1J, the first singulation results in first cutting slots P1. The first cutting slots P1 extend through the heat sink matrix 108 and partially through the package body 126. In some embodiments, the extent of the first cutting slots P1 may be half the thickness T1 of the package body 126, as shown. With reference to the detail view on the right of FIG. 1J, the first cutting slots P1 singulate the heat sink matrix 108 to separate the heat dissipation units 108c from one another. However, the first cutting slots P1 do not extend entirely through the heat sink matrix 108, so that the matrix 108 remains intact. The advantages of the first cutting slots P1 extending only partially through the heat sink matrix 108 are discussed below. Two parallel first cutting slots P11 extend along one direction (e.g. the Y-axis), and two parallel second cutting slots P12 extend along a second perpendicular direction (e.g. the X-axis).

The first singulation penetrates the heat sink matrix 108 from the side of the heat sink matrix 108. Cutting from this side advantageously reduces or eliminates burrs that would otherwise form on edges of the singulated heat sinks 108c as a result of deformation of the metal heat sink matrix 108. The burrs are reduced or eliminated because metal shavings that are produced by the cutting action of a saw blade, for example, are pushed into the package body 126, rather than remaining on edges of the singulated heat sinks 108c. These metal shavings are later eliminated when a second singulation takes place, as described below.

Advantageously, the cutting slots P1 don't completely penetrate the package body 126, thereby leaving the matrix of packaged devices 142 intact, as shown in FIG. 1J. The matrix 142 facilitates precise placement of electrical contacts, such as solder balls, on the undivided second surface 116b of the substrate 116 using automatic placing equipment. Placement of electrical contacts is described further below.

Further, the cutting step that makes the slots P1 penetrating the heat sink matrix 108 is preferably performed before a heat-reflow process following a step of placing electrical contacts on the second surface 116b of the substrate 116. Performing the steps in this order can increase the accuracy of this precision step by reducing or eliminating warpage of the matrix of package devices 142 that can occur during and/or after the heat-reflow process. This advantage of the present embodiments is discussed further below.

In another implementation, markings can be formed on the exposed second surface 108b of the heat dissipation units 108c by laser marking, stenciling, or other patterning technology. For example, a trademark or product model can be marked on the second surface 108b of the heat dissipation units 108c.

Figure 1K:
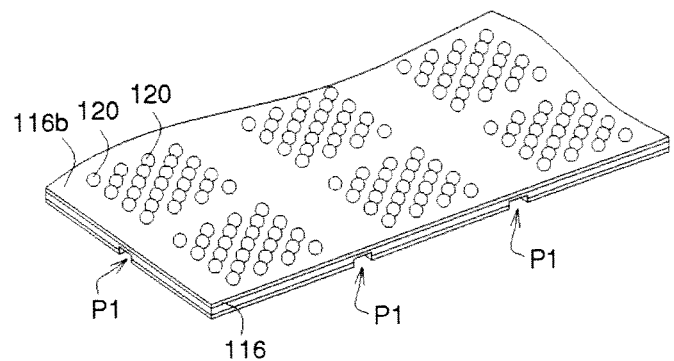

With reference to FIG. 1K, electrical contacts 120 are formed or placed on the second surface 116b of the substrate 116. The electrical contacts 120 may be solder balls, conductive pillars, bumps, or any other type of conductive elements. Prior to forming the electrical contacts 120, the matrix of packaged devices 142 may be inverted from the orientation shown in FIG. 1J, so that the second surface 116b of the substrate 116 faces upward, as shown in FIG. 1K, or faces any direction conducive to the formation of the electrical contacts 120. However, the inversion step may be omitted if the electrical contacts 120 can be formed efficiently without inverting the matrix of packaged devices 142.

Figure 1L:
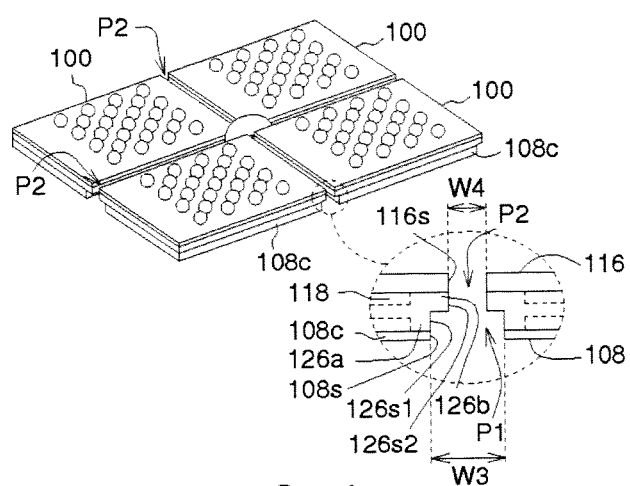

With reference to FIG. 1L, a second singulation is performed on the matrix of packaged devices 142. The second singulation may comprise sawing, laser cutting, abrasion, or any other singulation technique. The second singulation creates second cutting slots P2. With reference to the detail view of FIG. 1L, the second cutting slots P2 extend through the substrate 116 and into the package body 126 to join the first cutting slots P1, thereby completing the singulation and forming a plurality of semiconductor device packages 100. Advantageously, because the second singulation cuts only the substrate 116 and a portion of the package body 126 (and not the metal heat sink matrix 108), no metal burrs are formed during the second singulation.

With continued reference to the detail view of FIG. 1L, the package body 126 includes a first portion 126a adjacent to the heat dissipation device 108c and a second portion 126b adjacent to the substrate 116. Perimeter dimensions of the first portion 126a are less than those of the second portion 126b. A lateral surface 126s1 of the first portion 126a is substantially coplanar with a lateral surface 108s of the heat dissipation unit 108c, and a lateral surface 126s2 of the second portion 126b is substantially coplanar with a lateral surface 116s of the substrate 116.

With continued reference to the detail view of FIG. 1L, the width W3 of the first cutting slots P1 is less than the width W4 of the second cutting slots P2. Each package body 126 thus includes a shoulder that extends around its periphery and forms the dividing line between the first portion 126a and the second portion 126b. For each package body 126, the plan area of the heat dissipation unit 108c is smaller than the plan area of the substrate 116, so that the perimeter of the heat dissipation unit 108c is offset laterally inward from the perimeter of the substrate 116. In an alternative embodiment (not shown), the width W3 of the first cutting slots P1 may be smaller than the width W4 of the second cutting slots P2. In such an embodiment, the plan area of the substrate 116 is smaller than the plan area of the heat dissipation unit 108c, so that the perimeter of the substrate 116 is offset laterally inward from the perimeter of the heat dissipation unit 108c. In another embodiment (not shown), the width W3 of the first cutting slots P1 may be substantially equal to the width W4 of the second cutting slots P2. In such an embodiment, both cutting steps could be performed with the same saw blade in the case of a saw cut singulation. Using the same saw blade would advantageously reduce the complexity of the process, because there would be no need to change saw blades in between cutting steps.

Figure 2A:
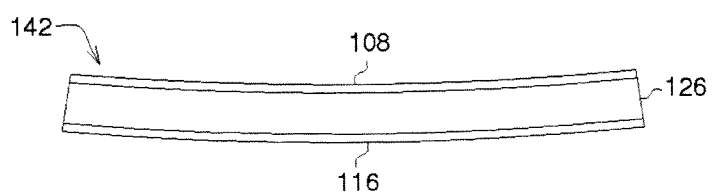
FIGS. 2A-2B illustrate process steps in two alternative methods of making a semiconductor device package.
Figure 2B:
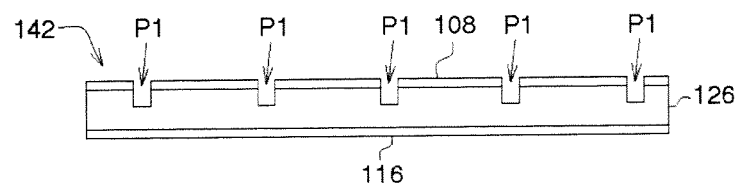

FIGS. 2A-2B illustrate another advantage of the present embodiments. FIG. 2A shows the matrix of packaged devices 142 as it would look if the first cutting slots P1 were not formed in the matrix 142 prior to performing the step of FIG. 1K, where the electrical contacts 120 are formed or placed on the second surface 116b of the substrate 116. Subsequent to forming or placing the electrical contacts 120, the electrical contacts 120 are typically reflowed. The heat of the reflow process warps the matrix 142 due to the differing coefficients of thermal expansion (CTEs) of the heat sink matrix 108, the package body 126, and the substrate 116, as shown in FIG. 2A. If, however, the first cutting slots P1 are formed in the matrix 142 prior to performing reflow, the first cutting slots P1 relieve stresses in the matrix 142 caused by the differing CTEs, so that little or no warpage occurs, as shown in FIG. 2B.

Figure 3A:
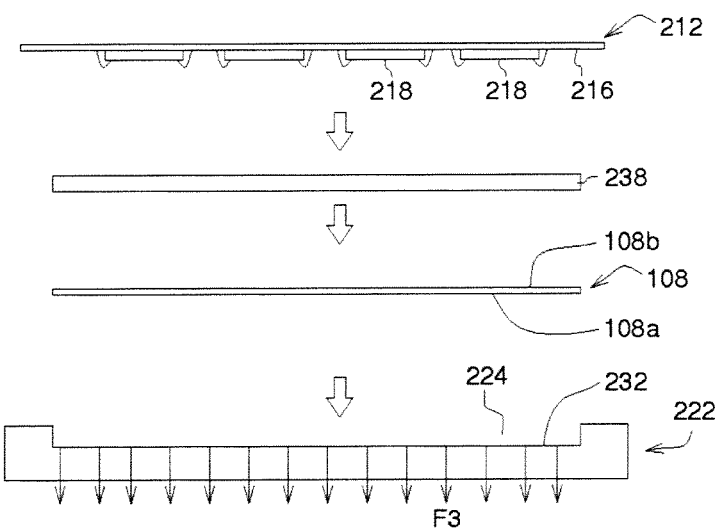
FIGS. 3A-3C illustrate process steps in another of the present embodiments of making a semiconductor device package.
Figure 3B:
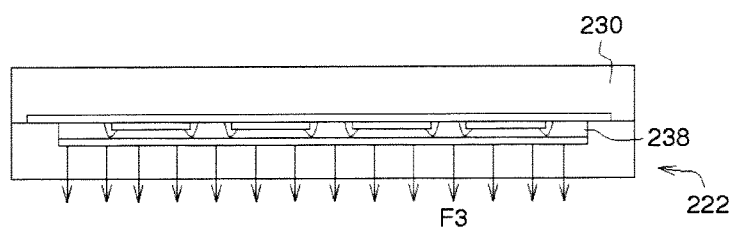
Figure 3C:
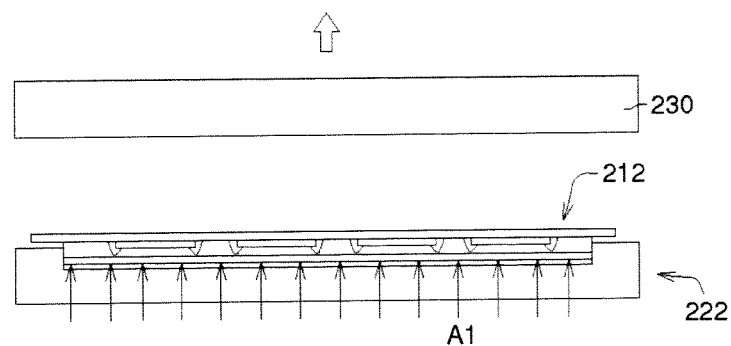

FIGS. 3A-3C illustrate an alternative method for packaging semiconductor devices. With reference to FIG. 3A, the heat sink matrix 108 is disposed in a cavity 224 of a package mold 222, wherein the first surface 108a of the heat sink matrix 108 faces a bottom surface 232 of the cavity 224. A vacuum force F3 holds the heat sink matrix 108 tightly against the cavity bottom surface 232. A packaging powder 238 is spread over the second surface 108b of the heat sink matrix 108. Then, semiconductor devices 218 disposed on a to-be-packaged element 212 are pushed into the packaging powder 238. Although not shown in FIG. 3A, the package mold 222 and the element 212 may include the first and second positioning pieces 128, 136 as in the embodiment of FIG. 1F.

With reference to FIG. 3B, a clamping operation is performed. As shown, a mold 230 presses a substrate 216 of the element 212 into the packaging powder 238 and clamps together with the package mold 222. After that, the packaging powder 238 is heated, until it melts. The liquefied packaging powder 238 uniformly encapsulates the semiconductor devices 218. Upon cooling, the packaging powder 238 condenses as a package body.

With reference to FIG. 3C, a de-molding process is performed. For example, the mold 230 is removed to expose the element 212. Then, the element 212 and the package mold 222 are separated. For example, the element 212 may be ejected from the package mold 222 by a burst of air A1 applied from beneath the element 212. After separating the element 212 from the package mold 222, the steps of forming the first cutting slots, the electrical contacts and the second cutting slots are performed as described above, so as to form a plurality of semiconductor device packages.

Figure 4:
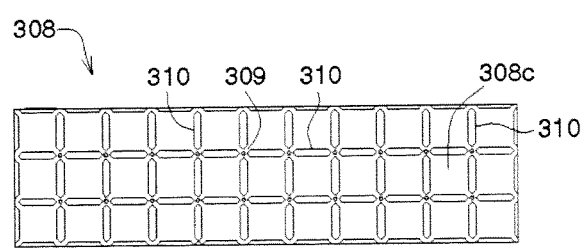
FIG. 4 illustrates a top view of a heat sink matrix used in one of the present embodiments of making a semiconductor device package.

With reference to FIG. 4, in some embodiments a heat sink matrix 308 used in a method of making a semiconductor device package may have a plurality of openings 310. The openings 310 may be formed by any method, such as laser cutting or etching. The openings 310 extend laterally and longitudinally to form a square grid pattern that defines a plurality of heat dissipation units 308c. The openings 310 may or may not fully penetrate the heat sink matrix 308, but even in an embodiment where they do fully penetrate the heat sink matrix 308 the openings 310 do not extend continuously across the heat sink matrix 308, and therefore do not completely separate the heat dissipation units 308c from one another. Rather, the heat sink matrix 308 remains a single piece due to the presence of spaced tabs 309 at corners of the heat dissipation units 308c. To form the first cutting slots P1 (discussed above, but not shown in FIG. 4) in the matrix 308 of FIG. 4, the first cutting slots P1 are formed along the openings 310. Since the heat sink matrix 308 of the present embodiment includes the openings 310, the singulation process is more efficient because there is less material to be removed. Wear and tear on the cutting instrument can thus be reduced, prolonging its lifespan.

As discussed above, single-step singulation from the substrate side results in unacceptable metal burrs. Single-step singulation form the heat sink side does not result in burrs, but if the package is singulated before the electrical contacts are attached to the substrate, the electrical contacts must then be attached to singulated packages. Attaching electrical contacts to singulated packages is a very complicated process. If the electrical contacts are attached prior to singulation, the subsequent reflow results in unacceptable warpage of the matrix due to the differing CTEs of the substrate, package body and heat sink. The present embodiments solve these problems by performing a first partial cut through the heat sink and partially through the package body. The first partial cut reduces or eliminates burrs, because it pushes the metal flash up into the saw street. Next, the electrical contacts are attached to the substrate, and a subsequent second cut singulates the package. Burrs and warpage are thus reduced or eliminated without any need to attach electrical contacts to singulated packages.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
a substrate including a first surface;
a semiconductor device is attached to the first surface of the substrate;
a package body disposed on the first surface of the substrate and covering at least the semiconductor device, the package body including a first portion having a first lateral surface and a second portion having a second lateral surface that is not coplanar with the first lateral surface; and
a heat dissipation unit disposed on the package body;
wherein the first lateral surface is substantially coplanar with a lateral surface of the heat dissipation unit, and the second lateral surface is substantially coplanar with a lateral surface of the substrate.

2. The semiconductor device package of claim 1, wherein the first portion of the package body is laterally recessed with respect to a periphery of the substrate.

3. The semiconductor device package of claim 1, wherein the second portion of the package body is laterally recessed with respect to a periphery of the heat dissipation unit.

4. The semiconductor device package of claim 1, wherein the package body includes a shoulder that extends around its periphery and forms a dividing line between the first portion and the second portion.

5. The semiconductor device package of claim 1, wherein a plan area of the heat dissipation unit is smaller than a plan area of the substrate.

6. The semiconductor device package of claim 1, wherein a plan area of the substrate is smaller than a plan area of the heat dissipation unit.

7. A semiconductor device package, comprising:
a substrate including a first surface and a substrate peripheral surface;
a semiconductor device attached to the first surface of the substrate;
a package body disposed on the first surface of the substrate and covering at least the semiconductor device, the package body including a first portion having a first package body peripheral surface and a second portion having a second package body peripheral surface; and
a heat dissipation unit disposed on the package body, the heat dissipation unit including a heat dissipation unit peripheral surface;
wherein the first package body peripheral surface is coplanar with the heat dissipation unit peripheral surface and the second package body peripheral surface is coplanar with the substrate peripheral surface; and
wherein the substrate peripheral surface and the heat dissipation unit peripheral surface are laterally offset from one another.

8. The semiconductor device package of claim 7, wherein the first package body peripheral surface is recessed laterally inward with respect to the second package body peripheral surface.

9. The semiconductor device package of claim 7, wherein the second package body peripheral surface is recessed laterally inward with respect to the first package body peripheral surface.

10. The semiconductor device package of claim 7, wherein the package body includes a shoulder that forms a dividing line between the first portion of the package body and the second portion of the package body.

11. The semiconductor device package of claim 7, wherein a plan area of the heat dissipation unit is smaller than a plan area of the substrate.

12. The semiconductor device package of claim 7, wherein a plan area of the substrate is smaller than a plan area of the heat dissipation unit.

* * * * *